United States Patent
Yun et al.

(10) Patent No.: US 8,003,431 B2
(45) Date of Patent: Aug. 23, 2011

(54) METHOD FOR ANTIREFLECTION TREATMENT OF A ZINC OXIDE FILM AND METHOD FOR MANUFACTURING SOLAR CELL USING THE SAME

(75) Inventors: Sun Jin Yun, Daejeon (KR); Jaemin Lee, Chungcheongnam-do (KR); Jun Kwan Kim, Daejeon (KR); JungWook Lim, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 12/909,144

(22) Filed: Oct. 21, 2010

(65) Prior Publication Data

US 2011/0092011 A1   Apr. 21, 2011

(30) Foreign Application Priority Data

Oct. 21, 2009 (KR) .................. 10-2009-0100361
Apr. 5, 2010 (KR) .................. 10-2010-0030874

(51) Int. Cl.
*H01L 21/00* (2006.01)

(52) U.S. Cl. .................. 438/85; 257/E21.294

(58) Field of Classification Search .......... 438/85, 438/478, 896; 257/E21.294; 216/13; 252/79
See application file for complete search history.

(56) References Cited

U.S. PATENT DOCUMENTS

| 4,166,919 | A | 9/1979 | Carlson |
| 4,450,316 | A | 5/1984 | Hamakawa et al. |
| 5,078,803 | A | 1/1992 | Pier et al. |
| 5,279,679 | A | 1/1994 | Murakami et al. |
| 7,682,882 | B2 * | 3/2010 | Ryu et al. ............ 438/149 |
| 2009/0101197 | A1 * | 4/2009 | Morikawa ............ 136/252 |
| 2009/0229664 | A1 * | 9/2009 | Appadurai ............ 136/261 |
| 2010/0288725 | A1 * | 11/2010 | Sun et al. ............ 216/13 |

FOREIGN PATENT DOCUMENTS

| EP | 0 371 582 A1 | 6/1990 |
| JP | 02-158175 A | 6/1990 |
| JP | 4305338 B2 * | 7/2009 |
| KR | 10-324450 | 1/2002 |

* cited by examiner

*Primary Examiner* — Matthew Smith
*Assistant Examiner* — Christine Enad
(74) *Attorney, Agent, or Firm* — Rabin & Berdo, P.C.

(57) ABSTRACT

Provided are a method for antireflection treatment of a zinc oxide film and a method for manufacturing a solar cell using the same. In the anti-reflection treatment, a substrate is prepared, then a polycrystalline zinc oxide film is formed on the substrate. A surface of the polycrystalline zinc oxide film is textured. Here, the roughening of the surface of the polycrystalline zinc oxide film comprises wet-etching the polycrystalline zinc oxide film on the substrate using an etching solution mixed with nitric acid and hydrogen peroxide.

16 Claims, 8 Drawing Sheets

METHOD FOR ANTIREFLECTION TREATMENT OF A ZINC OXIDE FILM AND METHOD FOR MANUFACTURING SOLAR CELL USING THE SAME

CROSS-REFERENCE TO RELATED APPLICATIONS

This U.S. non-provisional patent application claims priority under 35 U.S.C. §119 of Korean Patent Application Nos. 10-2010-0030874, filed on Apr. 5, 2010, and 10-2009-0100361, filed on Oct. 21, 2009, the entire contents of which are hereby incorporated by reference.

BACKGROUND OF THE INVENTION

The present invention disclosed herein relates to a method for treating anti-reflection of a zinc oxide film and a method for manufacturing a solar cell using the same, and more particularly, to a method for treating anti-reflection of a zinc oxide film and a method for manufacturing a solar cell using the same, which prevents reflection of sunlight by increasing surface roughness of the zinc oxide film.

Zinc oxides are well-known as semiconductor thin films for forming electronic elements such as Thin Film Transistors (TFT) and varistors. Zinc oxides may transmit visible rays due to its large band gap. Zinc oxides are doped with metal impurities increasing conductivity, and are being used as transparent conductive films in displays, solar cells, and touchscreen panels.

Zinc oxides may be uniformly deposited on substrates such as glass substrates, and the evenly-deposited zinc oxides may reflect at least a certain amount of light. For example, if zinc oxides used in solar cells reflect sunlight, it is difficult to achieve high efficiency because the reflected sunlight is not used to generate electricity.

SUMMARY OF THE INVENTION

The present invention provides a method for inducing anti-reflection of zinc oxide film and a method for manufacturing a solar cell using the same, which can reduce specular reflectance by increasing surface roughness of the zinc oxide.

Embodiments of the present invention provide methods for antireflection treatment of a zinc oxide film, comprising: preparing a substrate; forming a polycrystalline zinc oxide film on the substrate; and roughening a surface of the polycrystalline zinc oxide film, wherein the roughening of the surface of the polycrystalline zinc oxide film comprises wet-etching the polycrystalline zinc oxide film over the substrate using an etching solution mixed with nitric acid and hydrogen peroxide.

In some embodiments, the polycrystalline zinc oxide comprises at least one of Al, Ga, In, Sn, Cr, Cd, Ag, Na, Li, and B.

In other embodiments, the etching solution may further comprise weak acid.

In still other embodiments, the weak acid may comprise at least one of acetic acid, carbonic acid, phosphoric acid, boric acid, and formic acid.

In even other embodiments, the weak acid may be mixed in the etching solution at a mixture ratio of about 20% to about 80%.

In yet other embodiments, the etching solution may comprise nitric acid, acetic acid, hydrogen peroxide, and water that are mixed at a ratio of about 1:X:Y:Z, where X ranges from 100 to 200, Y ranges from 5 to 20, and Z ranges from 100 to 200.

In further embodiments, the nitric acid may be mixed in the etching solution at a mixture ratio of about 0.01% to about 5%.

In still further embodiments, the hydrogen peroxide may be mixed in the etching solution at a mixture ratio of about 0.1% to about 30%.

In even further embodiments, the etching solution may further comprise alcohol.

In yet further embodiments, the alcohol may comprise at least one of methyl alcohol, ethyl alcohol, and isopropyl alcohol.

In other embodiments, the alcohol may be mixed in the etching solution at a mixture ratio of about 0.1 to about 30%.

In still other embodiments of the present invention, methods for manufacturing a solar cell may comprise: treating anti-reflection of a zinc oxide film, roughening a surface of a polycrystalline zinc oxide film by wet-etching the polycrystalline zinc oxide film using an etching solution mixed with nitric acid and hydrogen peroxide; forming a semiconductor layer on the polycrystalline zinc oxide film; and forming an upper electrode layer on the semiconductor layer.

In some embodiments, the polycrystalline zinc oxide comprises at least one of Al, Ga, In, Sn, Cr, Cd, Ag, Na, Li, and B.

In other embodiments, the etching solution may comprise at least one of weak acids comprising acetic acid, phosphoric acid, boric acid, carbonic acid, and formic acid.

In still other embodiments, the semiconductor layer may comprise at least one of intrinsic semiconductors comprising a group IV semiconductor, a group III-V compound semiconductor, a group II-VI compound semiconductor, and a chalcopyrite-type compound semiconductor.

In even other embodiments, the forming of the semiconductor layer may comprise: forming a p-type semiconductor layer on the polycrystalline zinc oxide film; forming an intrinsic semiconductor layer on the p-type semiconductor layer; and forming an n-type semiconductor layer on the intrinsic semiconductor layer.

In still other embodiments of the present invention, methods for manufacturing a solar cell comprise: forming a lower electrode on a substrate; forming a semiconductor layer on the lower electrode; and treating anti-reflection of zinc oxide, roughening a surface of a polycrystalline zinc oxide film by forming the polycrystalline zinc oxide film on the semiconductor layer as an upper electrode and then wet-etching the polycrystalline zinc oxide film using an etching solution mixed with nitric acid and hydrogen peroxide.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings:

FIGS. 1A to 2B are cross-sectional structures illustrating light reflection before and after an anti-reflection treatment of a zinc oxide film according to an embodiment of the present invention;

DETAILED DESCRIPTION OF PREFERRED EMBODIMENTS

Hereinafter, preferred embodiments of the present invention will be described below in more detail with reference to the accompanying drawings. Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims. Like reference numerals refer to like elements throughout.

In the following description, the technical terms are used only for explaining specific embodiments while not limiting the present invention. The terms of a singular form may include plural forms unless referred to the contrary. The meaning of "include," "comprise," "including," or "comprising," specifies a property, a region, a fixed number, a step, a process, an element and/or a component but does not exclude other properties, regions, fixed numbers, steps, processes, elements and/or components. Since preferred embodiments are provided below, the order of the reference numerals given in the description is not limited thereto. In addition, it will be understood that when an element such as a layer, film, region, or substrate is referred to as being "on" another element, it can be directly on the other element or intervening elements may also be present.

Figure 1A:
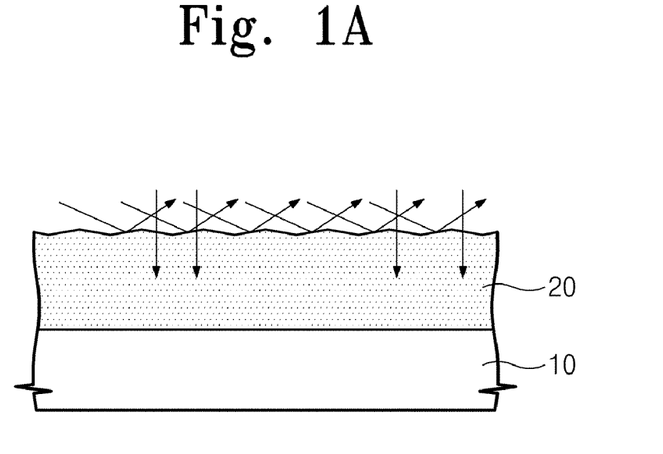
Figure 1B:
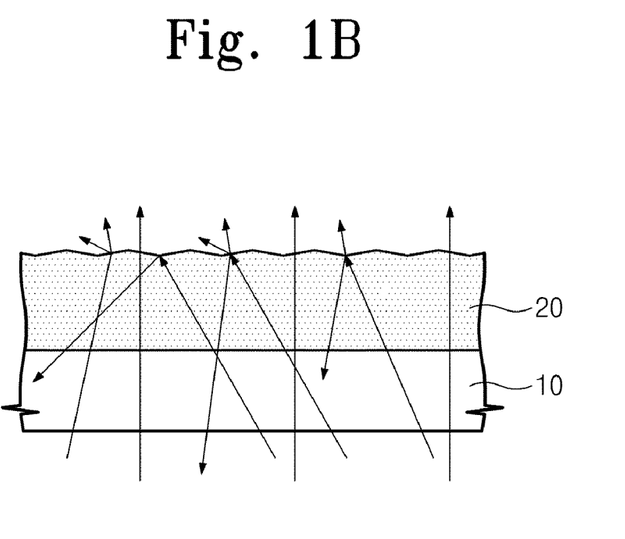
Figure 2A:
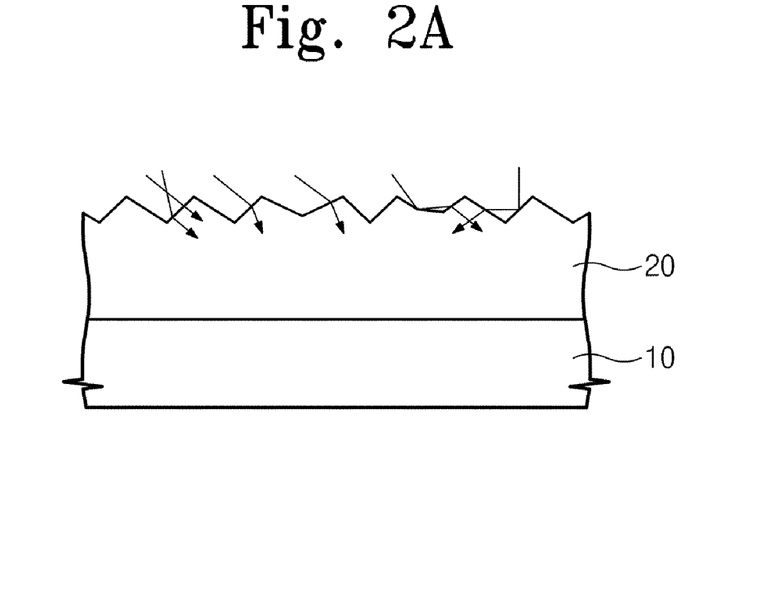
Figure 2B:
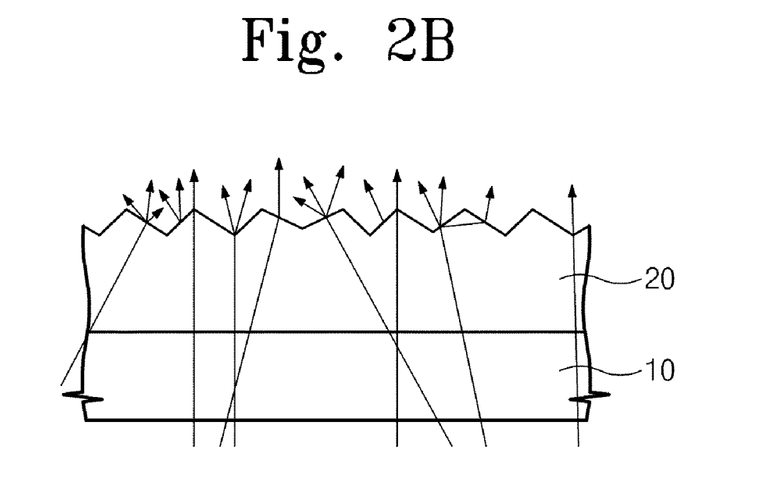

FIGS. 1A to 2B are cross-sectional diagrams illustrating light reflection before and after an anti-reflection treatment of a zinc oxide film according to an embodiment of the present invention. FIG. 1A and 1B show that a considerable amount of light is reflected from a zinc oxide film having a nearly flat surface before the anti-reflection treatment. FIGS. 2A and 2B show that light is mostly incident to a substrate without being reflected from the rough surface of the zinc oxide film after the anti-reflection treatment. The light scattered due to the rough surface travels long path inside the light absorbing layer compared to the light incident through a flat surface. The arrows shown in FIGS. 1A to 2B indicate light paths.

Referring to FIG. 1A, a polycrystalline zinc oxide film 20 may be deposited on a film or a substrate 10. The polycrystalline zinc oxide film 20 may become a window electrode that transmits light. The substrate 10 may comprise a transparent substrate or an opaque substrate. In case of a transparent substrate 10, another thin film may be further disposed between the substrate 10 and the polycrystalline zinc oxide film 20 to prevent light reflection. An anti-reflection layer may be further disposed on or under the substrate 10. The FIG. 1B shows the same structure of FIG. 1A except the input direction of light.

The polycrystalline zinc oxide film 20 may be doped with impurities that increase conductivity. For example, the polycrystalline zinc oxide film 20 may be doped with a conductive metal such as Al, Ga, In, Sn, Cr, Cd, Ag, Na, Li, or B. The polycrystalline zinc oxide film 20 may be uniformly deposited on the substrate 10. The polycrystalline zinc oxide film 20 having flat surface may reflect most of light that is obliquely incident to the substrate 10. Here, the arrows shown in FIG. 1 indicate travelling direction of light. When the light is incident through a transparent substrate 10, the light may reflect as shown in FIG. 1B.

Referring to FIG. 2A, the polycrystalline zinc oxide film 20 may be textured using an etching solution mixed with nitric acid and hydrogen peroxide. A surface of the polycrystalline zinc oxide film 20 may be unevenly textured by the etching solution mixed with nitric acid and hydrogen peroxide. The textured polycrystalline zinc oxide film 20 may have a substantially higher transmittance because scattering occurs on the surface of the textured polycrystalline zinc oxide film 20 and the total transmittance increases after texturing. FIG. 2B illustrates the case that the light transmits through a transparent substrate 10 and the total transmittance increases after texturing of zinc oxide film 20.

Accordingly, the anti-reflection treatment of a zinc oxide film according to an embodiment of the present invention may allow the polycrystalline zinc oxide film to transmit a large amount of light, and may minimize specular reflectance of the polycrystalline zinc oxide film 20.

Nitric acid, which is a strong acid, etches the polycrystalline zinc oxide film 20 quickly. Since concentrated nitric acid etches the polycrystalline zinc oxide film 20 very quickly, and makes the etched surface even, concentrated nitric acid may not be used for the purpose of reducing the reflectance. Accordingly, the etching solution may comprise only a small amount of nitric acid. For example, the etching solution may be diluted to contain about 0.01% to about 5% nitric acid.

The etching solution may comprise weak acids such as boric acid, carbonic acid, phosphoric acid, formic acid, and acetic acid. The weak acids may etch the polycrystalline zinc oxide film 20 slowly compared to the nitric acid. Since the weak acids may control the etch rate of the polycrystalline zinc oxide film 20, a larger amount of acid much weaker than the nitric acid may be mixed in the etching solution. For example, the etching solution may comprise about 20% to about 80% acetic acid as a weak acid. Also, the etching solution may comprise about 20% to about 80% boric acid, carbonic acid, phosphoric acid, or formic acid.

On the other hand, the weak acid or alcohol may increase etch selectivity of the polycrystalline zinc oxide film 20 according to crystal orientation and an etch rate at crystal grain boundary is higher than the grain itself. When the polycrystalline zinc oxide film 20 formed of poly crystalline grains is etched only by strong acid, the polycrystalline zinc oxide film 20 may be etched in all directions, which can not result in a considerable texturing effect. Etching solution comprising weak acid or alcohol may increase surface roughness of the polycrystalline zinc oxide film 20 by enhancing the etch selectivity. However the addition of weak acid or alcohol results in the decrease of etch rate, i.e. texturing rate.

Hydrogen peroxide may activate an etching of weak acid-diluted etching solution. Hydrogen peroxide may accelerate selective etching of the polycrystalline zinc oxide film 20. For example, the etching solution may comprise about 0.1% to about 30% hydrogen peroxide.

Figure 3:
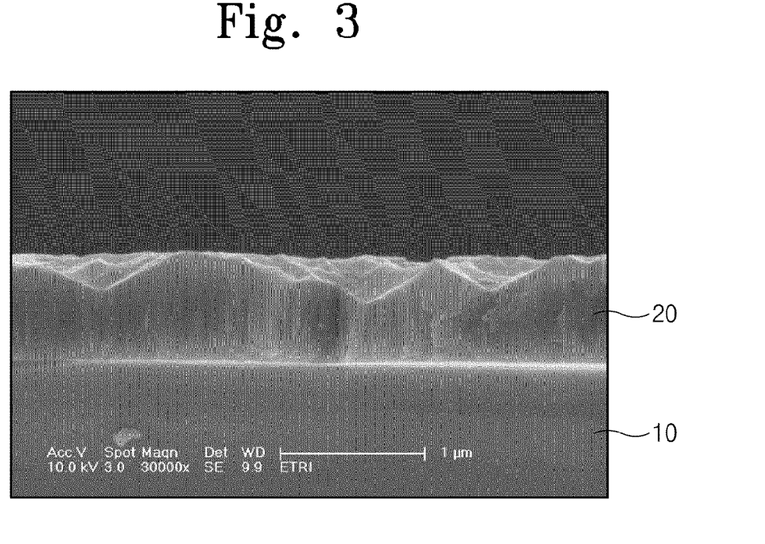
FIG. 3 is a Scanning Electron Microscope (SEM) picture showing a cross-section of a polycrystalline zinc oxide film formed by an anti-reflection treatment for a zinc oxide film according to an embodiment of the present invention.

FIG. 3 is a Scanning Electron Microscope (SEM) picture showing a cross-section image of a polycrystalline zinc oxide textured by an anti-reflection treatment for a zinc oxide film according to an embodiment of the present invention. Referring to FIG. 3, the anti-reflection treatment for a zinc oxide film may comprise unevenly etching the upper surface of the polycrystalline zinc oxide film 20 on the substrate 10. Here, the polycrystalline zinc oxide film 20 may be doped with a metal such as Ga, Al, In, Sn, Cr, Cd, Ag, Na, or Li, or B.

Figure 4:
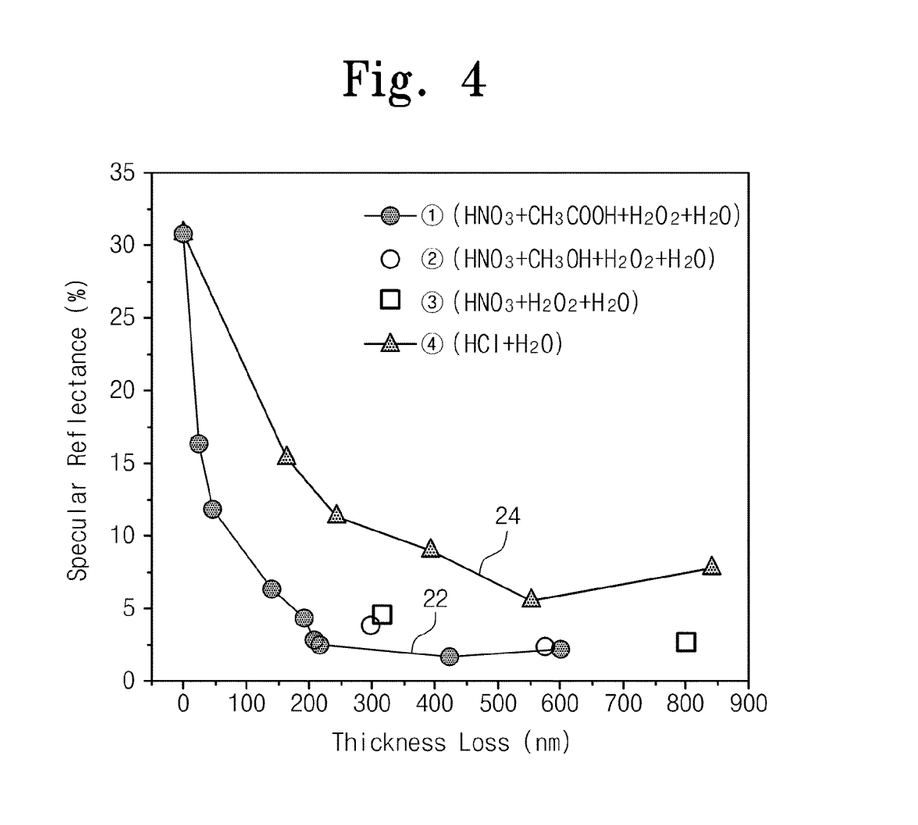
FIG. 4 is a graph illustrating the variation of specular reflectance according to an etched thickness of a polycrystalline zinc oxide film that is etched by an anti-reflection treatment for a zinc oxide film according to an embodiment of the present invention.

FIG. 4 is a graph illustrating the variation of specular reflectance according to an etched thickness of a polycrystalline zinc oxide film that is etched by an anti-reflection treatment for a zinc oxide film according to an embodiment of the present invention.

Referring to FIG. 4, the anti-reflection treatment for a zinc oxide film deposited on polished Si substrate may minimize specular reflectance by etching the polycrystalline zinc oxide film 20 using a first etching solution ① mixed with nitric acid, acetic acid, hydrogen peroxide, and water. Here, a horizontal axis of the graph indicates the variation of "the etched thickness (i.e., decrease of thickness due to etching)". The variation of the etched thickness may be derived from a sheet resistance and thicknesses measured before and after etching of the polycrystalline zinc oxide film 20. Also, a vertical axis of the graph indicates the variation of specular reflectance. The specular reflectance was measured using UV-V is spectroscopy. The first etching solution ① may minimize the specular reflectance of the polycrystalline zinc oxide film 20 as shown in a first graph 22. The first graph 22 shows that the specular reflectance rapidly decreases in an initial etching stage of the polycrystalline zinc oxide film 20. The first etching solution ① may etch the polycrystalline zinc oxide film 20 by about 200 nm to reduce the specular reflectance of the polycrystalline zinc oxide film to about 2.5%. For example, the first etching solution ① may be mixed with nitric acid, acetic acid, hydrogen peroxide, and water at a ratio of 1:X:Y:Z, where X ranges from 100 to 200, Y ranges from 5 to 20, and Z ranges from 100 to 200.

A second etching solution ② may comprise a mixture of nitric acid, alcohol, hydrogen peroxide, and water. The alcohol may comprise methyl alcohol, ethyl alcohol, and isopropyl alcohol. The alcohol may be mixed at a ratio of about 0.1% to about 30%. A third solution ③ may comprise a mixture of nitric acid, hydrogen peroxide, and water. The second and third etching solutions ② and ③ may show results nearly identical to that obtained by the first solution ①. The first graph 22 may show that a specular reflectance of about 5% or less has been obtained by etching the polycrystalline zinc oxide film 20 by a thickness of about 300 nm. Since the first and third etching solutions ① and ③ could etch the polycrystalline zinc oxide film 20 more quickly than the second etching solution ②, it is possible to select etching solution according to the purposes. The etch rate may also be increased by increasing the content of hydrogen peroxide or nitric acid. However, the increase of nitric acid content may reduce the etch selectivity.

A fourth etching solution ④ shows a result obtained by using a typical solution mixed with hydrochloric acid and water. The fourth etching solution ④ may change the specular reflectance of the polycrystalline zinc oxide film gently as shown in a second graph 24. The fourth etching solution ④ may etch the polycrystalline zinc oxide film 20 by a thickness of about 400 nm to reduce the specular reflectance of the surface of the polycrystalline zinc oxide film 20 to about 9%. While etching the polycrystalline zinc oxide film 20 by a thickness of about 600 nm, the fourth etching solution ④ may not reduce the specular reflectance of the surface of the polycrystalline zinc oxide film 20 to about 5% or less. In order to reduce the specular reflectance, since a thickness of the etched polycrystalline zinc oxide film 20 needs to be more increased, the polycrystalline zinc oxide film 20 initially needs to be deposited thicker. Accordingly, there are disadvantages in terms of both productivity and cost. In case that the remaining polycrystalline zinc oxide film 20 is thin, the polycrystalline zinc oxide film 20 may not be suitable for a window electrode because resistance increases. That is, a greater reduction in specular reflectance with less etching is much more desirable.

While etching the polycrystalline zinc oxide film 20 much more thinly than the fourth etching solution, the first to third etching solutions ①, ② and ③ may further reduce the specular reflectance of the surface of the polycrystalline zinc oxide film 20. For example, reflectance lower than 5% can be obtained with etching 150~200 nm of the polycrystalline zinc oxide film using the etching solutions ①, ② and ③. However, approximately 550 nm of the film should be etched by the etching solution ④ in order to obtain the same reflectance. Accordingly, the first to third etching solutions ①, ② and ③ may make the surface of the polycrystalline zinc oxide film 20 rougher compared to hydrochloric acid of the fourth etching solution ④. The first to third etching solutions ①, ② and ③ may reduce the specular reflectance by unevenly etching the surface of the polycrystalline zinc oxide film 20 from the initial etching stage.

Accordingly, the anti-reflection treatment for the zinc oxide film can reduce the specular reflectance of the surface of the polycrystalline zinc oxide film 20 by etching the polycrystalline zinc oxide film 20 using an etching solution mixed with weak acid or alcohol, nitric acid, hydrogen peroxide and water.

Hereinafter, a method for manufacturing a solar cell using the anti-reflection treatment for a zinc oxide film will be described in detail with reference to the accompanying drawings.

FIGS. 5 to 11 are cross-sectional diagrams s illustrating a method for manufacturing a solar cell according to a first embodiment of the present invention. The method for manufacturing a solar cell according to the first embodiment may comprise a method for manufacturing a superstrate-type solar cell that absorbs light transmitted through a transparent substrate.

Figure 5:
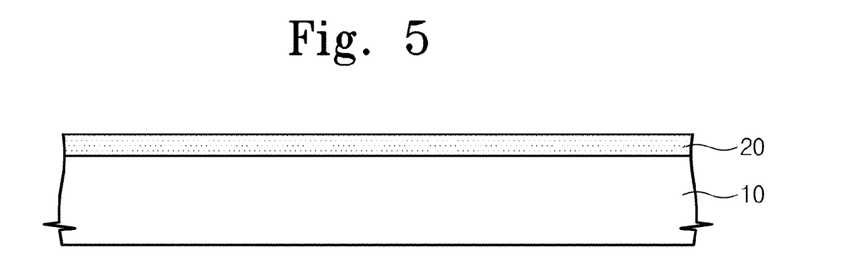
FIGS. 5 to 11 are cross-sectional diagrams illustrating a method for manufacturing a solar cell according to a first embodiment of the present invention.

Referring to FIG. 5, the method for manufacturing a solar cell according to the first embodiment may comprise forming a polycrystalline zinc oxide film 20 on a substrate 10. Here, the substrate 10 may comprise a transparent substrate transmitting light. For example, the substrate may comprise a glass substrate. The polycrystalline zinc oxide film 20 may be a lower electrode. The polycrystalline zinc oxide film 20 may be formed by sputter deposition, RF-magnetron sputter deposition, DC-magnetron sputter deposition, and Chemical Vapor Deposition (CVD). For example, the polycrystalline zinc oxide film 20 may be formed to have a thickness of about 500 nm to about 3000 nm.

Figure 6:
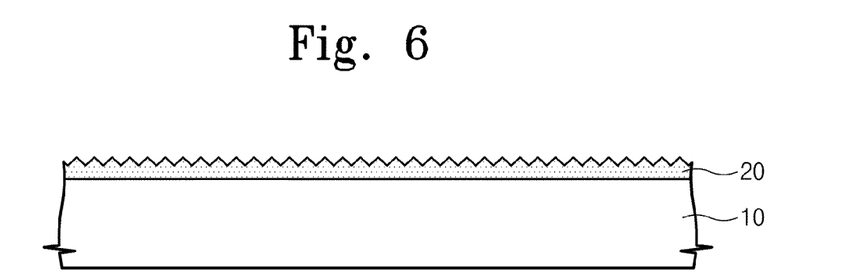

Referring to FIG. 6, the polycrystalline zinc oxide film 20 may be textured with an etching solution comprising nitric acid and hydrogen peroxide. Here, the etching solution may comprise at least one of acetic acid, carbonic acid, boric acid, phosphoric acid, and formic acid. For example, nitric acid, acetic acid, hydrogen peroxide, and water may be mixed at a ratio of 1:X:Y:Z, where X ranges from 100 to 200, Y ranges from 5 to 20, and Z ranges from 100 to 200. in the etching solution. The surface of the polycrystalline zinc oxide film 20 may be unevenly etched as a window electrode by the etching solution. The etching solution comprising nitric acid and hydrogen peroxide may comprise at least one of methyl alcohol, ethyl alcohol, and isopropyl alcohol.

Figure 7:
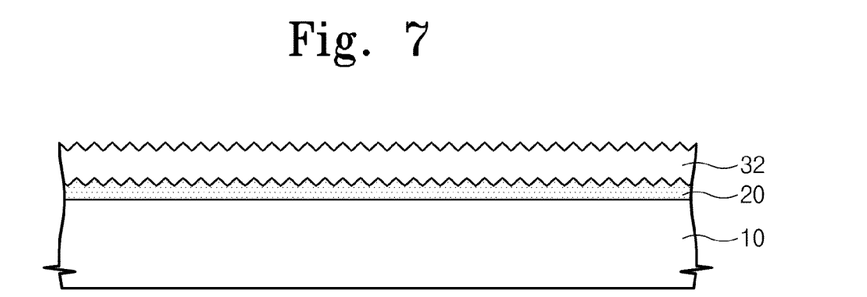

Referring to FIG. 7, a p-type first semiconductor layer 32 may be formed on the polycrystalline zinc oxide film 20. The first semiconductor layer 32 may comprise a group IV semiconductor layer doped with p-type impurities, a group III-V semiconductor layer, a group II-VI semiconductor layer, or chalcopyrite-type compound semiconductor layer.

Figure 8:
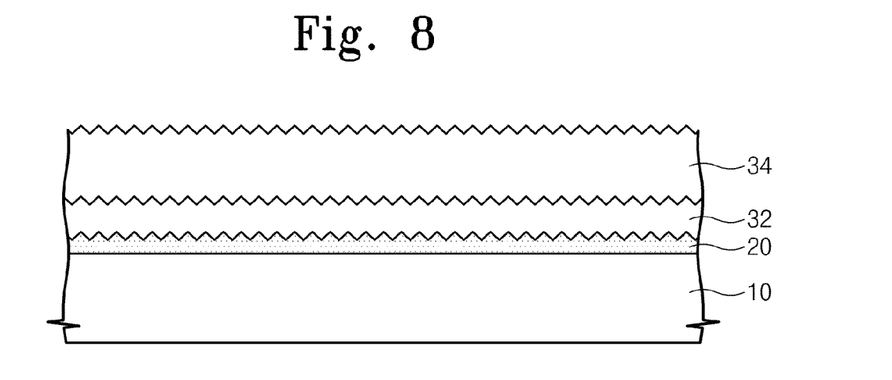

Referring to FIG. 8, an intrinsic second semiconductor layer 34 may be formed on the first semiconductor layer 32. The second semiconductor layer 34 may comprise at least one of silicon and germanium as a group IV intrinsic semiconductor layer. The second semiconductor layer 34 may comprise a group III-V semiconductor layer, a group II-VI semiconductor layer, or chalcopyrite-type compound semiconductor layer. For example, the group III-V semiconductor layer may comprise GaAs. The group II-VI semiconductor layer may comprise CdTe, ZnS, or CdS. The chalcopyrite-type compound semiconductor layer may comprise one selected from the group consisting of CuInSe, $CuInSe_2$, CuInGaSe, $CuInGaSe_2$.

Figure 9:
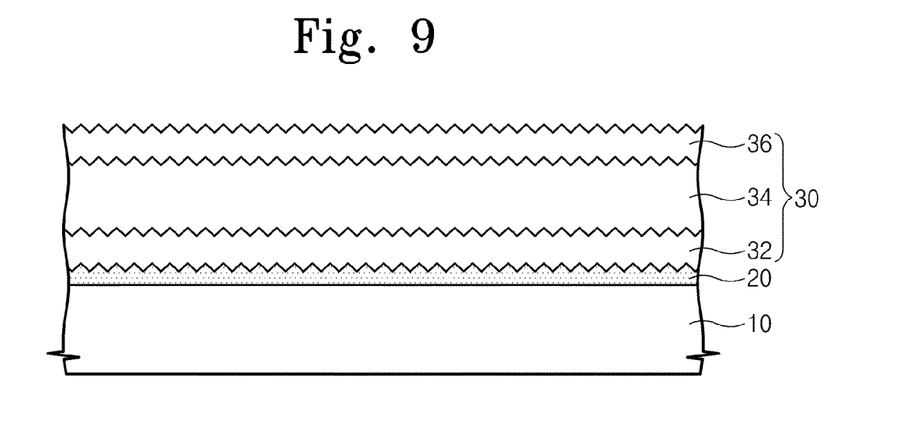

Referring to FIG. 9, an n-type third semiconductor layer 36 may be formed by doping n-type conductive impurities on the upper surface of the second semiconductor layer 34. For example, the third semiconductor layer 36 may comprise a group IV semiconductor layer, a group III-V semiconductor layer, a group II-VI semiconductor layer, or chalcopyrite-type compound semiconductor layer, which is doped with n-type impurities. The first to third semiconductor layer 30 may be formed of the same material or different compounds. The n-type semiconductor layer 36 may be formed on p-type semiconductor layer 32 without intrinsic semiconductor layer 34.

Although not shown, the first to third semiconductor layers 30 may be repeatedly stacked to increase the absorption of light.

Figure 10:
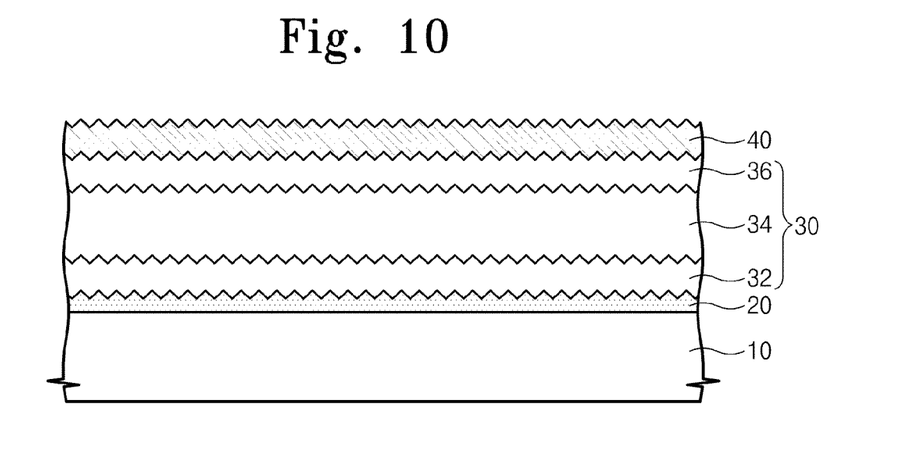

Referring to FIG. 10, an upper electrode layer 40 may be formed on the first to third semiconductor layers 30. The upper electrode layer 40 may be formed by a sputter deposition, CVD, screen printing, or electron-beam deposition process. The upper electrode layer 40 may have a low resistivity. For example, the upper electrode layer 40 may comprise at least one of aluminum, silver, and copper. Since having excellent electric conductivity and high reflectance, aluminum and silver may be used as good electrode materials. For example, the upper electrode layer 40 may comprise molybdenum. Molybdenum may have high electric conductivity, ohmic contact characteristic with chalcopyrite-type semiconductor layers, and high-temperature stability under a selenium atmosphere. The upper electrode layer 40 may be formed to have a thickness of about 0.1 μm to about 3 μm.

Figure 11:
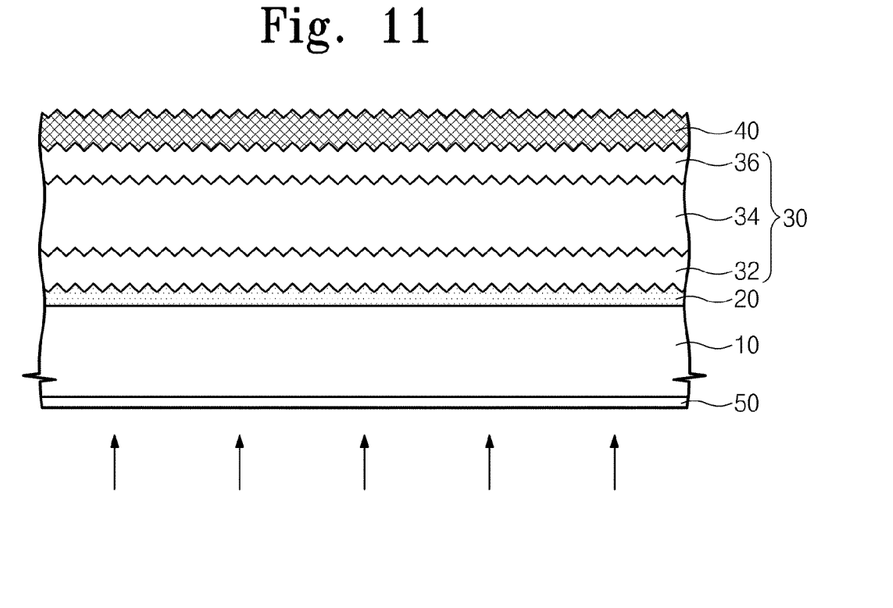

Referring to FIG. 11, an anti-reflection layer 50 may be formed under the substrate 10 facing the upper electrode layer 40. The anti-reflection layer 50 may prevent the reflection of light transmitting through the substrate 10. The anti-reflection layer 50 may comprise a transparent material having a lower refractive index than a glass substrate. The anti-reflection layer 50 may increase the intensity of the transmitted light to the substrate 10. The arrows shown in FIG. 11 indicate a travelling direction of light.

Accordingly, the method for manufacturing a solar cell according to the first embodiment of the present invention may minimize the reflectance of incident light and increase the traveling length of light inside the semiconductor layers by texturing the polycrystalline zinc oxide film 20 using an etching solution comprising nitric acid and hydrogen peroxide. Light having passed through substrate 10 and the polycrystalline zinc oxide film 20 may transmit through a boundary surface between the first semiconductor layer 32 and the polycrystalline zinc oxide film 20 without being reflected to the backside direction.

FIGS. 12 to 19 are diagrams illustrating a method for manufacturing a solar cell according to a second embodiment of the present invention. The method for manufacturing a solar cell according to the first embodiment may comprise a method for manufacturing a superstrate-type solar cell that absorbs light transmitted through a transparent substrate.

Figure 12:
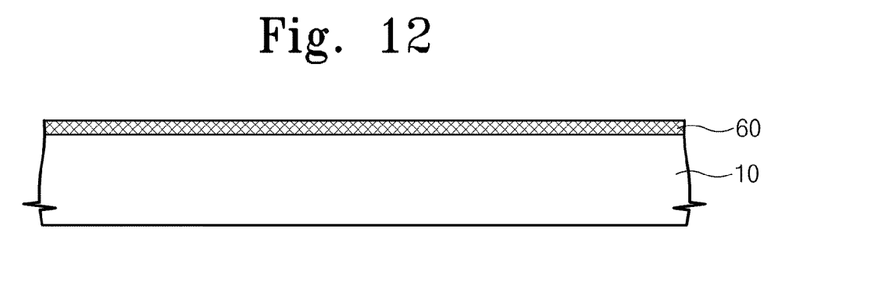
FIGS. 12 to 19 are sectional plans illustrating a method for manufacturing a solar cell according to a second embodiment of the present invention.
Figure 13:
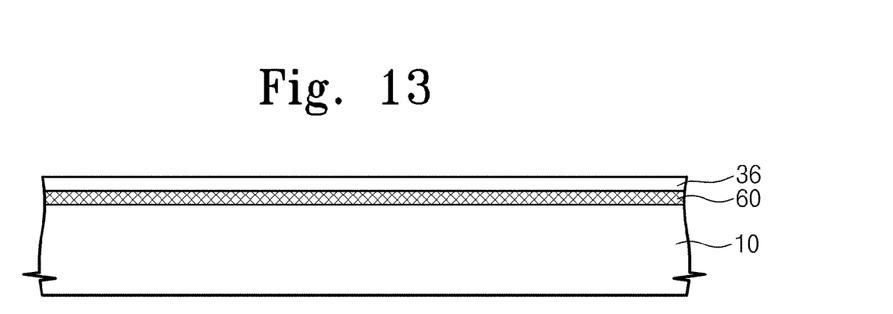

Referring to FIG. 12, a lower electrode layer 60 may be formed on a substrate 10. The substrate 10 may be formed of one of a sodalime substrate, a ceramic substrate such as alumina, a stainless steel plate or foil, a metal substrate such as a copper foil or ribbon, and a polymer film. According to an embodiment of the present invention, the substrate 10 may be formed of sodalime glass. The lower electrode layer 60 may be formed by a sputter deposition, CVD, or electron-beam deposition or screen printing process. The lower electrode layer 60 may be formed of a low-resistivity material that has excellent adhesion with substrate 10 and does not have a significant difference from the substrate 10 in the coefficient of thermal expansion so that a peeling phenomenon due to the difference in the coefficient of thermal expansion may not occur. Specifically, the lower electrode layer 60 may be formed of molybdenum. Molybdenum may have high electric conductivity, ohmic contact characteristic with chalcopyrite-type thin films, and high-temperature stability under a selenium atmosphere. The lower electrode 60 may be formed of aluminum or silver, or transparent conducting materials. The lower electrode layer 60 may be formed to have a thickness of about 0.1 μm to about 3 μm. When the electrode layer 60 is zinc oxide doped with impurities, the layer 60 may be textured using the etching solution according to the present invention Referring to FIG. 13, an n-type third semiconductor layer 36 may be formed on the lower electrode layer 60. The third semiconductor layer 36 may make ohmic-contact with the lower electrode 60. The third semiconductor layer 36 may comprise a group IV semiconductor layer doped with impurities such as P, Sb, or As, a group III-V semiconductor layer doped n-type dopant, a group II-VI semiconductor layer, or chalcopyrite-type compound semiconductor layer.

Figure 14:
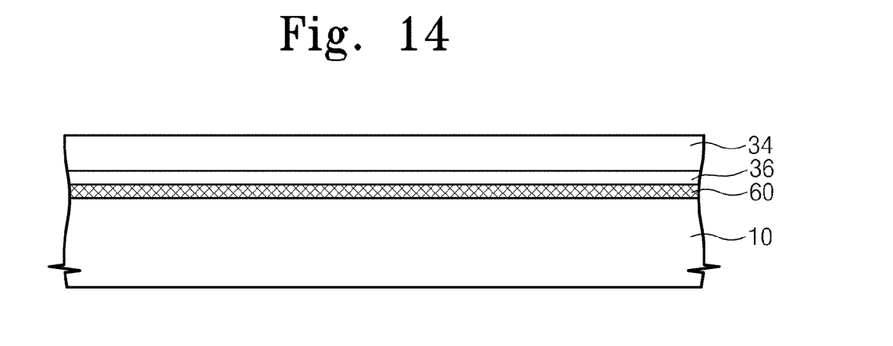

Referring to FIG. 14, an intrinsic second semiconductor layer 34 may be formed on the third semiconductor layer 36. The second semiconductor layer 34 may comprise at least one of silicon and germanium as a group IV intrinsic semiconductor layer. The second semiconductor layer 34 may comprise a group III-V semiconductor layer, a group II-VI semiconductor layer, or chalcopyrite-type compound semiconductor layer. For example, the group III-V semiconductor layer may comprise GaAs. The group II-VI semiconductor layer may comprise CdTe, ZnS, or CdS. Also, the chalcopyrite-type compound semiconductor layer may comprise one selected from the group consisting of CuInSe, $CuInSe_2$, CuInGaSe, $CuInGaSe_2$.

Figure 15:
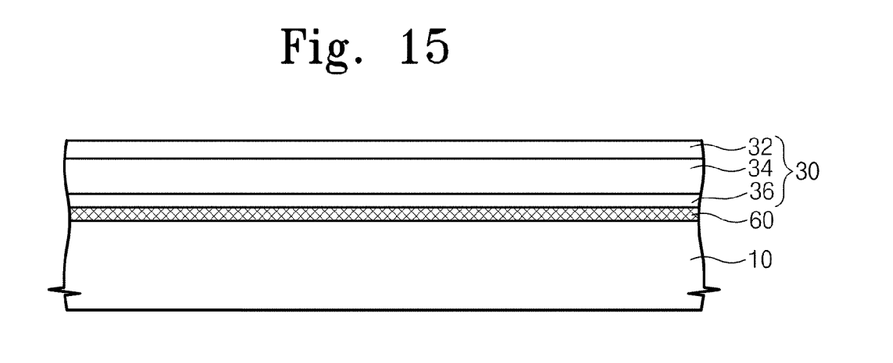

Referring to FIG. 15, a p-type first semiconductor layer 32 may be formed. The first semiconductor layer 32 may comprise a group IV semiconductor layer comprising one of silicon and germanium which are doped with p-type impurities, a group III-V, a group II-VI, or chalcopyrite-type compound semiconductor layer. The p-type semiconductor may be directly formed on the n-type semiconductor without intrinsic semiconductor layer. Although not shown, the third to first semiconductor layers 30 may also be repeatedly stacked to increase optical absorption. On the contrary to FIG. 13~15, the p-type first semiconductor 32 may be formed on the electrode 60, and intrinsic semiconductor layer 34 may be formed on the p-type semiconductor layer 32, and then the n-type semiconductor layer 36 may be formed on the intrinsic semiconductor layer 34.

Figure 16:
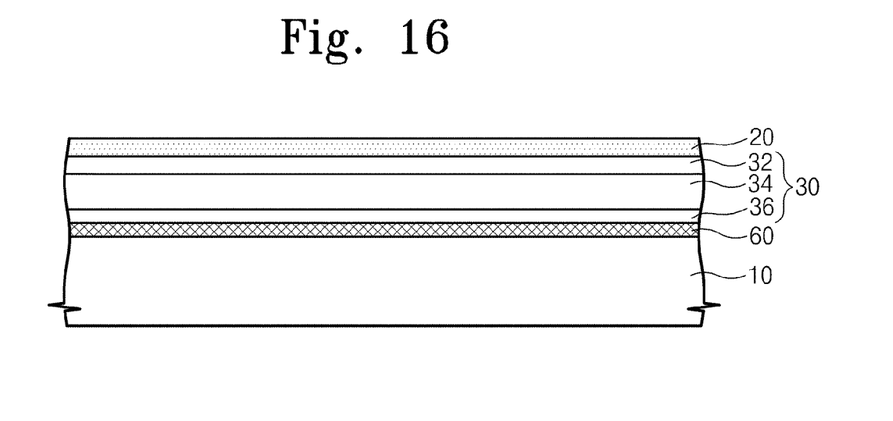

Referring to FIG. 16, a polycrystalline zinc oxide film 20 may be formed on the first semiconductor layer 32. Here, the polycrystalline zinc oxide film 20 may be used as an upper electrode. The polycrystalline zinc oxide film 20 may be formed by one of sputtering, RF-magnetron sputter deposition, DC-magnetron sputter deposition, and CVD processes. For example, the polycrystalline zinc oxide film 20 may be formed to have a thickness of about 500 nm to 3000 nm. The first to third semiconductor 30 may be formed of the same material or different compounds.

Figure 17:
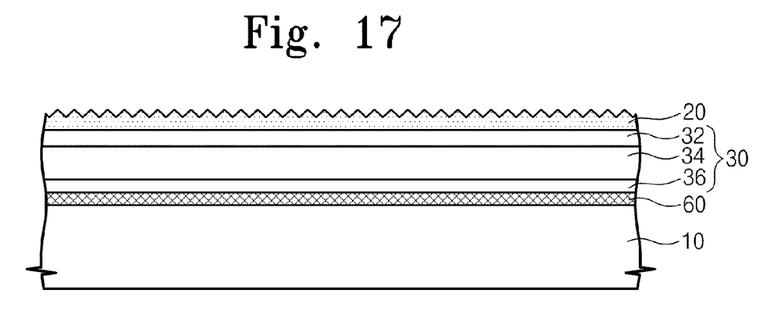

Referring to FIG. 17, the polycrystalline zinc oxide film 20 may be textured using an etching solution comprising nitric acid and hydrogen peroxide. Here, the etching solution may comprise acetic acid, carbonic acid, boric acid, phosphoric acid, and formic acid. For example, nitric acid, acetic acid, hydrogen peroxide, and water may be mixed at a ratio of 1:X:Y:Z, where X ranges from 100 to 200, Y ranges from 5 to 20, and Z ranges from 100 to 200. According to another embodiment, the etching solution may comprise alcohol instead of weak acid.

Figure 18:
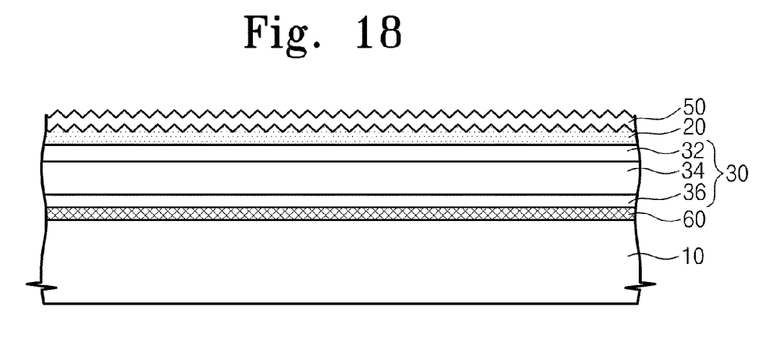

Referring to FIG. 18, an anti-reflection layer 50 may be formed on the polycrystalline zinc oxide film 20. The anti-reflection layer 50 may prevent incident light from being reflected, and may have a lower refractive index than the polycrystalline zinc oxide film 20. For example, the anti-reflection layer 50 may have a refractive index that is greater than that of air and lower than that of the polycrystalline zinc oxide film. When the surface roughness of the polycrystalline zinc oxide film 20 is more than a certain level, the anti-reflection layer 50 may be omitted. The antireflection layer may be used as a passivation layer of the layers 20 and 30 by preventing the permeation of the water vapor and oxygen.

Figure 19:
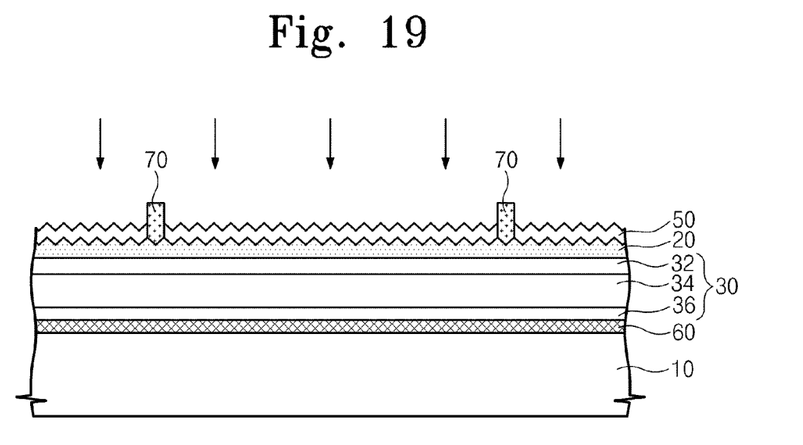

Referring to FIG. 19, a grid 70 may be formed on the anti-reflection layer 50. The grid 70 may comprise at least one of aluminum, silver, copper, and nickel. The grid 70 may be patterned to have a minimum area and line width to increase incidence efficiency of light. The grid 70 may be patterned by one of photolithography process, screen printing process, and silk printing process. The grid 70 may make electrically ohmic contact with the polycrystalline zinc oxide film 20 after being diffused into the inside of the anti-reflection layer 50 through a thermal process.

Accordingly, the method for manufacturing a solar cell according to the second embodiment of the present invention may make the surface of the polycrystalline zinc oxide film 20 formed on the first and third semiconductor layer 30 uneven using an etching solution comprising nitric acid and hydrogen peroxide. The polycrystalline zinc oxide film 20 may reduce the reflectance of light and increase the transmitted light to the light absorbing layers through the anti-reflection layer 50.

As described above, the reflectance of a polycrystalline zinc oxide film can be minimized by etching the polycrystalline zinc oxide formed on a substrate by using an etching solution.

In addition, while the polycrystalline zinc oxide film is etched using an etching solution comprising nitric acid, hydrogen peroxide, acetic acid, and alcohol, a lower reflectance can be obtained than that obtained by etching the polycrystalline zinc oxide film 20 using a typical HCl solution.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method for antireflection treatment of a zinc oxide film, comprising:
   preparing a substrate;
   forming a polycrystalline zinc oxide film including polycrystalline grains and crystal grain boundaries on the substrate; and
   roughening a surface of the polycrystalline zinc oxide film,
   wherein the roughening of the surface of the polycrystalline zinc oxide film comprises wet-etching the polycrystalline zinc oxide film on the substrate using an etching solution mixed with nitric acid and hydrogen peroxide,
   wherein the polycrystalline zinc oxide film has a higher etch rate at the crystal grain boundaries than at the polycrystalline grains with the etching solution,
   wherein the etching solution further comprises weak acid increasing an etch selectivity of the polycrystalline zinc oxide film according to crystal orientation.

2. The method of claim 1, wherein the polycrystalline zinc oxide comprises at least one of Al, Ga, In, Sn, Cr, Cd, Ag, Na, Li, and B.

3. The method of claim 1, wherein the weak acid comprises at least one of acetic acid, carbonic acid, phosphoric acid, boric acid, and formic acid.

4. The method of claim 3, wherein the weak acid is mixed in the etching solution at a mixture ratio of 20% to 80%.

5. The method of claim 3, wherein the etching solution comprises nitric acid, acetic acid, hydrogen peroxide, and water that are mixed at a ratio of 1:X:Y:Z, where X ranges from 100 to 200, Y ranges from 5 to 20, and Z ranges from 100 to 200.

6. The method of claim 1, wherein the nitric acid is mixed in the etching solution at a mixture ratio of 0.01% to 5%.

7. The method of claim 1, wherein the hydrogen peroxide is mixed in the etching solution at a mixture ratio of 0.1 to 30%.

8. The method of claim 1, wherein the etching solution further comprises alcohol.

9. The method of claim 8, wherein the alcohol comprises at least one of methyl alcohol, ethyl alcohol, and isopropyl alcohol.

10. The method of claim 8, wherein the alcohol is mixed in the etching solution at a mixture ratio of about 0.1 to about 30%.

11. A method for manufacturing a solar cell, comprising:
   treating anti-reflection of a zinc oxide film including polycrystalline grains and crystal grain boundaries, roughening a surface of a polycrystalline zinc oxide film by wet-etching the polycrystalline zinc oxide film using an etching solution mixed with nitric acid and hydrogen peroxide;
   forming a semiconductor layer on the polycrystalline zinc oxide film; and
   forming an upper electrode layer on the semiconductor layer,
   wherein the polycrystalline zinc oxide film has a higher etch rate at the crystal grain boundaries than at the polycrystalline grains with the etching solution,
   wherein the etching solution further comprises weak acid increasing an etch selectivity of the polycrystalline zinc oxide film according to crystal orientation.

12. The method of claim 11, wherein the polycrystalline zinc oxide comprises at least one of Al, Ga, In, Sn, Cr, Cd, Ag, Na, Li, and B.

13. The method of claim 11, wherein the weak acid comprises at least one of acetic acid, phosphoric acid, boric acid, carbonic acid, and formic acid.

14. The method of claim 11, wherein the semiconductor layer comprises at least one of intrinsic semiconductors comprising a group IV semiconductor, a group III-V compound semiconductor, a group II-VI compound semiconductor, and a chalcopyrite-type compound semiconductor.

15. The method of claim 11, wherein the forming of the semiconductor layer comprises:
   forming a p-type semiconductor layer on the polycrystalline zinc oxide film;
   forming an intrinsic semiconductor layer on the p-type semiconductor layer; and
   forming an n-type semiconductor layer on the intrinsic semiconductor layer.

16. A method for manufacturing a solar cell, comprising:
   forming a lower electrode on a substrate;
   forming a semiconductor layer on the lower electrode; and
   treating anti-reflection of a zinc oxide film including polycrystalline grains and crystal grain boundaries, roughening a surface of a polycrystalline zinc oxide film by forming the polycrystalline zinc oxide film on the semiconductor layer as an upper electrode and then wet-etching the polycrystalline zinc oxide film using an etching solution mixed with nitric acid and hydrogen peroxide,
   wherein the polycrystalline zinc oxide film has a higher etch rate at the crystal grain boundaries than at the polycrystalline grains with the etching solution,
   wherein the etching solution further comprises weak acid increasing an etch selectivity of the polycrystalline zinc oxide film according to crystal orientation.

* * * * *